US010534388B1

(12) United States Patent
Ilardo

(10) Patent No.: US 10,534,388 B1
(45) Date of Patent: Jan. 14, 2020

(54) TEMPERATURE LIMITED CURRENT DRIVER

(71) Applicant: STMicroelectronics S.r.l., Agrate Brianza (MB) (IT)

(72) Inventor: Santo Ilardo, Catania (IT)

(73) Assignee: STMicroelectronics S.r.l., Agrate Brianza (MB) (IT)

( * ) Notice: Subject to any disclaimer, the term of this patent is extended or adjusted under 35 U.S.C. 154(b) by 0 days.

(21) Appl. No.: 16/361,545

(22) Filed: Mar. 22, 2019

(51) Int. Cl.
| G05F 1/567 | (2006.01) |
| H03K 3/011 | (2006.01) |
| G05F 1/575 | (2006.01) |
| H03F 3/45 | (2006.01) |

(52) U.S. Cl.
CPC .............. *G05F 1/567* (2013.01); *G05F 1/575* (2013.01); *H03K 3/011* (2013.01); *H03F 3/45475* (2013.01); *H03F 2200/129* (2013.01); *H03F 2203/45116* (2013.01)

(58) Field of Classification Search
CPC ........ H03K 3/011; G01R 19/32; G01R 21/14; G05F 1/46; G05F 1/461; G05F 1/462; G05F 1/463; G05F 1/569
See application file for complete search history.

(56) References Cited

U.S. PATENT DOCUMENTS

| 8,901,992 B1* | 12/2014 | Lim | ........................ G05F 1/465 327/512 |
| 9,450,533 B2 | 9/2016 | Karwath et al. | |
| 2004/0021505 A1* | 2/2004 | Watanabe | ................. G05F 1/56 327/540 |
| 2013/0291555 A1 | 11/2013 | Edwards et al. | |
| 2013/0308240 A1* | 11/2013 | Yu | .......................... G01R 31/40 361/103 |
| 2014/0015446 A1* | 1/2014 | Peng | ....................... G06F 1/206 315/309 |

FOREIGN PATENT DOCUMENTS

JP 2002304225 A 10/2002

OTHER PUBLICATIONS

"5.0 A Throttle Control H-Bridge," Freescale Semiconductor Advance Information, Doc. No. MC33926, Rev. 8.0, Jan. 2009, 2007-2009 (25 pages).
Philips Xitanium LED Extreme Drivers, "Reliable Xtreme technology for demanding LED Applications," Aug. 2017 (49 pages).

* cited by examiner

*Primary Examiner* — Gary L Laxton
(74) *Attorney, Agent, or Firm* — Crowe & Dunlevy

(57) ABSTRACT

A driver circuit includes a temperature sensor generating a first voltage representative of current operating temperature. An amplifier compares the first voltage to a second voltage representative of an upper threshold operating temperature, and generates a control signal based thereupon. A variable current source generates a load current from the control signal. The amplifier generates the control signal to cause the variable current source to generate the load current as having a magnitude equal to an upper threshold when the first voltage is less than the second voltage. The amplifier generates the control signal to cause the variable current source to generate the load current as having a magnitude that is decreasing until the first and second voltages are equal, and then generates the control signal to cause the variable current source to maintain the load current magnitude at a level at which the first and second voltages are equal.

17 Claims, 6 Drawing Sheets

TEMPERATURE LIMITED CURRENT DRIVER

TECHNICAL FIELD

This disclosure is related to the field of driver circuits used in integrated circuits, and in particular, to a driver circuit for use in an integrated circuit and that has self-protection features incorporated therein to protect against exceeding safe operating temperatures.

BACKGROUND

Driver circuits may be used in integrated circuits. For example, International Electrotechnical Commission (IEC) standard 61131-2 defines communications between sensors and activators and programmable logic controllers (PLC) in industrial applications. This standard allows both ends of the communications link between sensors and activators and PLCs to manage bus contention or driving high loads by defining a current limit in short circuit conditions. In such short circuit or overcurrent conditions, the driver circuits within the integrated circuits of either the sensors and activators or the PLCs would otherwise dissipate excessive current, exceeding safe operating temperatures and damaging the integrated circuits. Therefore, such driver circuits incorporate self-protection features to help ensure that safe operating temperatures are not exceeded, during short circuit conditions or otherwise.

Typically, such known self-protection features impose a fixed safe duty cycle on the output stage of the driver circuit during short circuit or overcurrent situations, with this fixed safe duty cycle being known to keep operating temperatures in a safe region. There may also be a fixed reduction of the value of the current limit in such conditions. While these self-protection features may be adequate to protect the integrated circuits from damage, they are inherently overly conservative to ensure they work in all conditions, meaning that average load current is lower than it could be. It would be desirable to be able to deliver a higher average load current than provided by driver circuits incorporating known self-protection features. Therefore, further development in this area is required.

SUMMARY

Disclosed herein is a driver circuit including a temperature sensing circuit configured to generate a first voltage representative of current operating temperature of the driver circuit, and a voltage controlled current source configured to compare the first voltage to a second voltage representative of an upper threshold operating temperature and to generate a control signal based upon the comparison. The driver circuit also includes an output stage generating a load current as a function of the control signal. The amplifier generates the control signal so as to cause the variable current source to generate the load current as having a magnitude equal to an upper threshold, when the first voltage is less than the second voltage. The voltage controlled current source generates the control signal so as to cause the output stage to generate the load current as decreasing in magnitude until the first and second voltages are equal, and to then generate the control signal so as cause the output stage to maintain the magnitude of the load current at a level at which the first and second voltages are equal. The temperature sensing circuit may include a bipolar junction transistor having a collector coupled to a first supply voltage, a base coupled to a bandgap voltage, and an emitter coupled to the voltage controlled current source. A resistor may be coupled between the emitter of the bipolar junction transistor and ground, with the first voltage being generated across the resistor.

The voltage controlled current source may be an operational transconductance amplifier having a non-inverting terminal coupled to the second voltage and an inverting terminal coupled to the first voltage. A voltage divider may be coupled between a bandgap voltage and ground, with a center tap of the voltage divider being coupled to the non-inverting terminal of the operational transconductance amplifier. A bandgap voltage generator may generate the bandgap voltage.

The output stage may include a current amplifier configured to amplify a magnitude of a current of the control signal. A current source may generate the load current as a function of the amplified control signal. The current source may include a first current mirror receiving the control signal as input and generating a second control signal as output, and a second current mirror receiving the second control signal as input and generating the load current as output.

The first current mirror may include a first NMOS transistor having a drain coupled to the current amplifer to receive the amplified control signal, a source coupled to ground, and a gate coupled to the drain of the first NMOS transistor. The first current mirror may also include a second NMOS transistor having a drain drawing the second control signal, a source coupled to ground, and a gate coupled to the gate of the first NMOS transistor.

The second current mirror may include a first PMOS transistor having a source coupled to a second supply voltage, a drain coupled to the drain of the second NMOS transistor, and a gate coupled to the drain of the first PMOS transistor. The second current mirror may also include a second PMOS transistor having a source coupled to the second supply voltage, a drain generating the load current, and a gate coupled to the gate of the first PMOS transistor.

Also disclosed herein are method aspects. A method disclosed herein is for generating a load current for driving a load. This method includes generating a first voltage representative of a current operating temperature, comparing the first voltage to a second voltage representative of an upper threshold operating temperature, generating the load current having a magnitude equal to an upper threshold when the first voltage is less than the second voltage, and generating the load current as having a magnitude with a decreasing slope when the first voltage is greater than the second voltage. When the first and second voltages are equal, the load current is generated as having a magnitude that remains at a level at which the first and second voltages are equal.

Generating the load current as having a magnitude that remains at a level at which the first and second voltages are equal may include continuously varying a magnitude of the load current such that the first and second voltages remain equal.

DETAILED DESCRIPTION

The following disclosure enables a person skilled in the art to make and use the subject matter disclosed herein. The general principles described herein may be applied to embodiments and applications other than those detailed above without departing from the spirit and scope of this disclosure. This disclosure is not intended to be limited to the embodiments shown, but is to be accorded the widest scope consistent with the principles and features disclosed or suggested herein.

This disclosure, in general, is directed to a driver circuit for use in an integrated circuit (IC) that incorporates self-protection features to help ensure that safe operating temperatures are maintained. In particular, rather than use duty cycling as with conventional designs, this driver circuit uses current regulation to maintain operating temperature in short circuit or overcurrent conditions while still maintaining continuous load current delivery.

Figure 1:
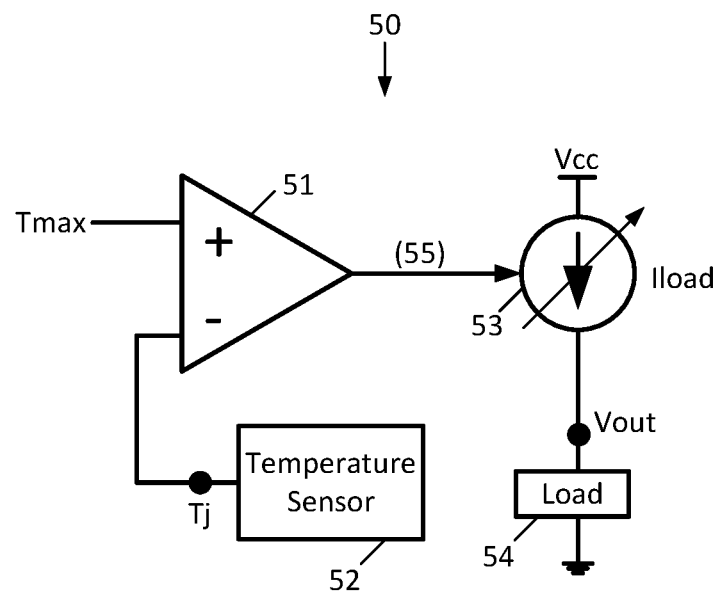
FIG. 1 is a schematic block diagram of a driver circuit incorporating self-protection features to maintain operating temperature at a safe level, in accordance with this disclosure.

With reference to FIG. 1, a first embodiment of the driver plus temperature regulation circuit 50 is now described. The driver circuit 50 is incorporated within an integrated circuit, and includes an amplifier 51, a temperature sensor 52, and a continuously controllable current source 53. The amplifier 51 has a non-inverting terminal connected to a voltage Tmax that correlates to a maximum safe operating temperature for the driver circuit 50 and/or the integrated circuit into which the driver circuit 50 is incorporated, and an inverting terminal connected to a voltage Tj output by the temperature sensor 52. The voltage Tj output by the temperature sensor 52 is representative of the current operating temperature of the driver circuit 50 and/or the integrated circuit into which the driver circuit 50 is incorporated. The output of the amplifier 51 produces a control signal 55 that is fed to a control input of the current source 53. The current source 53 provides a load current Iload to a load 54. The output voltage Vout is the voltage across the load 54. The driver circuit 50 may be used in any suitable environment, such as a so-called IO-Link interface or SIO interface within an integrated circuit, as well as any suitable output stage for any input/output interface.

Figure 2:
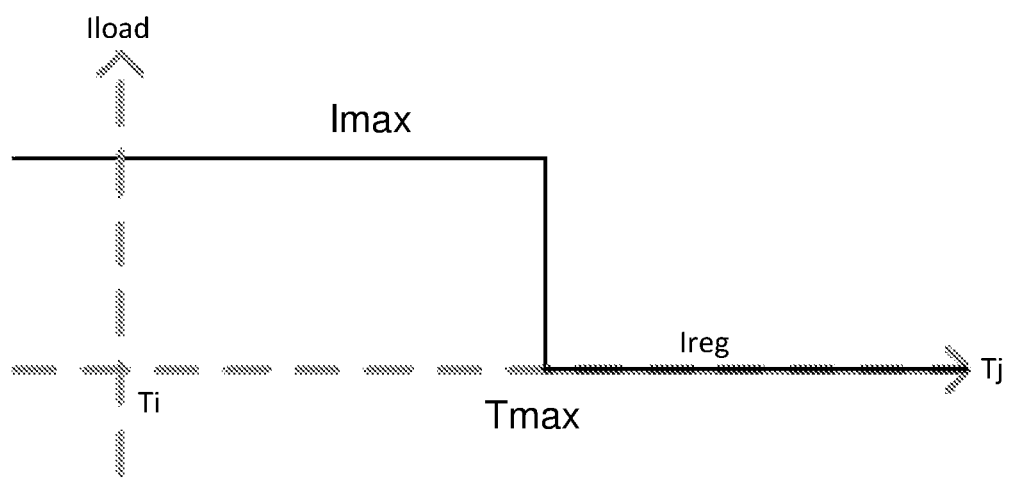
FIG. 2 is a graph showing the load current provided by the driver circuit of FIG. 1 over temperature as represented by the voltage Tj output by the temperature sensor.

Referring additionally to FIG. 2, operation of the driver circuit 50 is now described. In operation, while Tj is below Tmax, the control signal 55 is generated by the amplifier 51 so as to instruct the current source 53 to output the load current Iload as being equal to a maximum safe current Imax. When Tj reaches Tmax, the control signal 55 is generated by the amplifier 51 so as to instruct the current source 53 to output the load current Iload at a regulated value at which Tj will be equal to Tmax. This is seen in FIG. 2, where the magnitude of Iload is equal to Imax where Tj is between an initial value Ti and Tmax, and then falls to the regulated value Ireg once Tj is equal to or greater than Tmax. The regulated value Ireg can be as low as zero, yet Tj can continue to rise due to external heating, for example. Note that this is not a set drop in load current Iload, but is a continuous regulation of the load current Iload, meaning that Iload is continuously variable and continuously adjusted by the current source 53 at instruction of the amplifier 51 as a result of the feedback from the temperature sensor 52. Note also that the load current Iload is continuous, and is not discontinuous, as would occur with duty cycling. Thus, duty cycling is not performed by the driver circuit 50, and instead the load current Iload is continuously delivered while being continuously adjusted as a function of feedback from the temperature sensor 52 in a fashion so as to cause Tj to settle at, or be substantially equal to, Tmax. Therefore, as conditions change (e.g., ambient temperature changes), then Iload will be adjusted (e.g., increased or decreased) so as to maintain Tj at Tmax.

Figure 3:
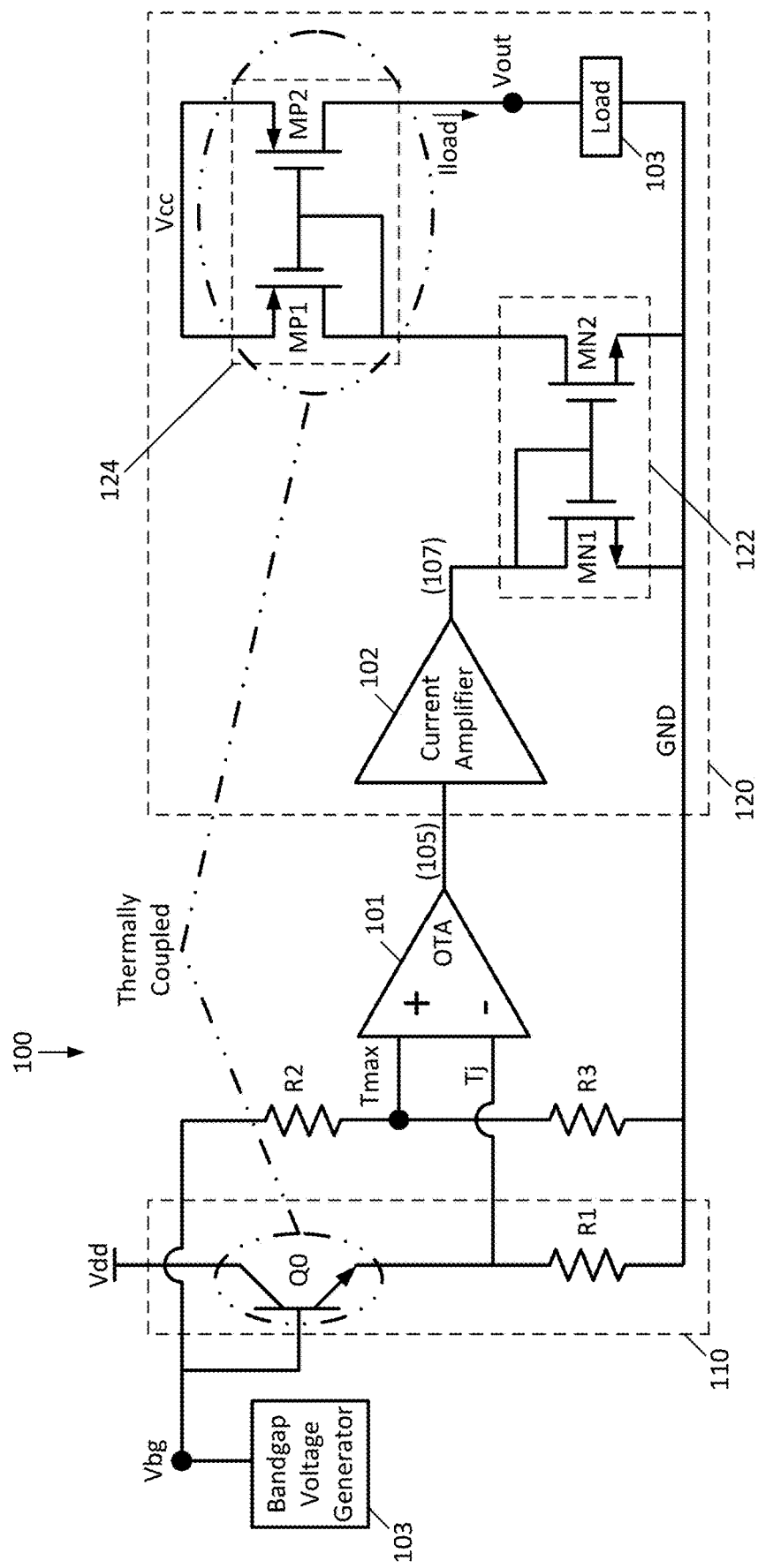
FIG. 3 is a schematic diagram of another driver circuit incorporating self-protection features to maintain operating temperature at a safe level, in accordance with this disclosure.

A more detailed embodiment of the driver circuit 100 is now described with reference to FIG. 3. The driver circuit 100 includes a bandgap voltage generator 103 that generates a bandgap voltage Vbg that is temperature independent, and a temperature sensing circuit 110 that receives the bandgap voltage Vbg as input and generates the voltage Tj representative of the current operating temperature of the driver circuit 100 and/or the integrated circuit into which the driver circuit 100 is incorporated as output.

In greater detail, the temperature sensing circuit 110 is comprised of an NPN transistor Q0 having its collector connected to Vdd and its base connected to the bandgap voltage Vbg. A resistor R1 is connected between the emitter of the NPN transistor Q0 and ground, and the voltage Tj is generated across the resistor R1. Note the thermal coupling between NPN transistor Q0 and PMOS current mirror 124, which may be present due to proximity between the NPN transistor Q0 and the PMOS current mirror 124 in the layout of the temperature sensing circuit 100 as fabricated.

A resistive divider formed from resistor R2 and R3 is connected between the bandgap voltage Vbg and ground, and the voltage Tmax that correlates to a maximum safe operating temperature for the driver circuit 100 and/or the integrated circuit into which the driver circuit 100 is incorporated is generated at the central tap of the resistive divider.

An amplifier 101, which is an operational transconductance amplifier and therefore operates as a voltage controlled current source, has its non-inverting terminal connected to the center tap of the voltage divider formed from resistors R2 and R3 to receive Tmax and its inverting terminal connected to the emitter of NPN transistor Q0 to receive Tj. The amplifier 101 generates the control signal 105 at its output.

An output stage 120 receives the control signal 105 and continuously variably generates the load current Iload as a function of the control signal 105. The voltage Vout is generated across the load 103 as a function of the load current Iload. The load current Iload is continuously generated, not discontinuously generated, and not generated using duty cycling.

In greater detail, the output stage 120 includes a current amplifier 102 which receives the control signal 105 as input, amplifies the magnitude of its current, and outputs it as amplified control signal 107 to an NMOS current mirror 122. The NMOS current mirror 122 may have a unity mirroring ratio (or other suitable mirroring ratio) and mirrors the amplified control signal 107 to its output for receipt by a PMOS current mirror 124. The PMOS current mirror 124 has its input connected to the output of the NMOS current mirror 122, may have a non-unity mirroring ratio (such as, for example, 1:1000), and generates the load current Iload at its output, ultimately as a function of the control signal 105.

In greater detail, the NMOS current mirror is comprised of NMOS transistor MN1 receiving the amplified control signal 107 at its drain, having its gate connected to its drain, and having its source connected to ground. The NMOS current mirror 122 also includes NMOS transistor MN2 having its gate connected to the gate of NMOS transistor MN1, its source connected to ground, and its drain connected to the PMOS current mirror 124.

In addition, also in greater detail, the PMOS current mirror 124 is comprised of PMOS transistor MP1 having its drain connected to the drain of NMOS transistor MN2, its source connected to Vcc, and its gate connected to its drain. The PMOS current mirror 124 also includes PMOS transistor MP2 having its source connected to Vcc, its gate connected to the gate of PMOS transistor MP1, and its drain connected to the load 103 to provide the load current Iload.

In general, in operation, the amplifier 101 compares Tmax to Tj and generates the control signal 105 based upon the comparison. Where Tj is below Tmax (indicating a safe operating temperature), the amplifier 101 generates the control signal 105 so as to result in the load current Iload being equal to the maximum load current Imax. As Tj approaches Tmax, such as may occur in the presence of a short across the load 103, the amplifier 101 generates the control signal 105 so as to result in the load current Iload decreasing in magnitude, thereby lowering the operating temperature (and thus Tj). Once Tj resultingly falls to (or ceases rising) be equal to Tmax, regulation is performed, with the control signal 105 being varied by the amplifier 101 so as to maintain Iload at a level at which Tj is no greater than Tmax. Note that at this point (where Tj is equal to Tmax), Iload is less than Imax, as Iload being equal to Imax would result in excess power dissipation and therefore an operating temperature greater than a maximum safe operating temperature. If Tj falls to be less than Tmax, then the amplifier 101 will generate the control signal 105 so as to increase the load current Iload until it becomes once again equal to Imax (operating temperature permitting), and will maintain the load current Iload at Imax provided Tj remains less than Tmax.

Figure 4:
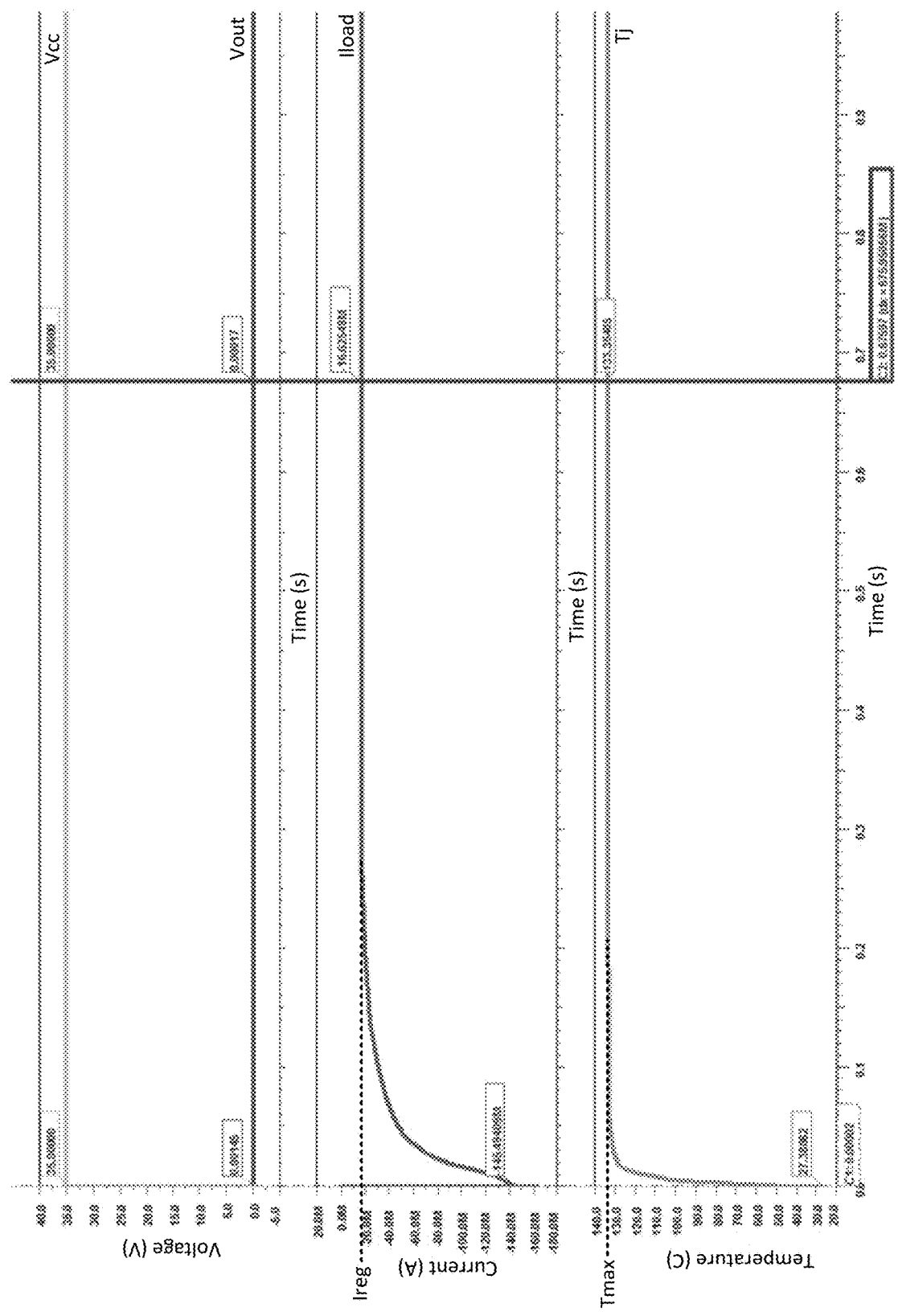
FIG. 4 is a graph showing the load current provided by the driver circuit of FIG. 3 as well as voltage across the load, over time and temperature, in a first operating condition.

A first example of this operation can be seen in FIG. 4. In this scenario, the drain of PMOS transistor MP2 is effectively shorted to ground (and thus a short across the load 103 is present), and therefore Vout remains within a threshold of zero. Also in this example, Vcc is set at 35 V and remains steady. At time 0 (the beginning), the voltage Tj indicates an operating temperature of 27.38° C., which is well below Tmax as set for this scenario (which represents an operating temperature of 133° C.). Resultingly, the load current Iload is generated as being equal to Imax for this scenario (the magnitude of which is 145.5 mA). However, as time begins to pass, the operating temperature begins to rise (and Tj therefore rises), and the magnitude of load current Iload resultingly falls. As Tj approaches Tmax, indicating that the operating temperature approaches 133° C., the magnitude of the load current Iload approaches the regulated value Ireg (the magnitude of which is set to 16.6 mA for this scenario). Regulation maintains Iload at Ireg, which in turn maintains Tj at Tmax (and thus maintains the operating temperature at of 133° C.).

Figure 5:
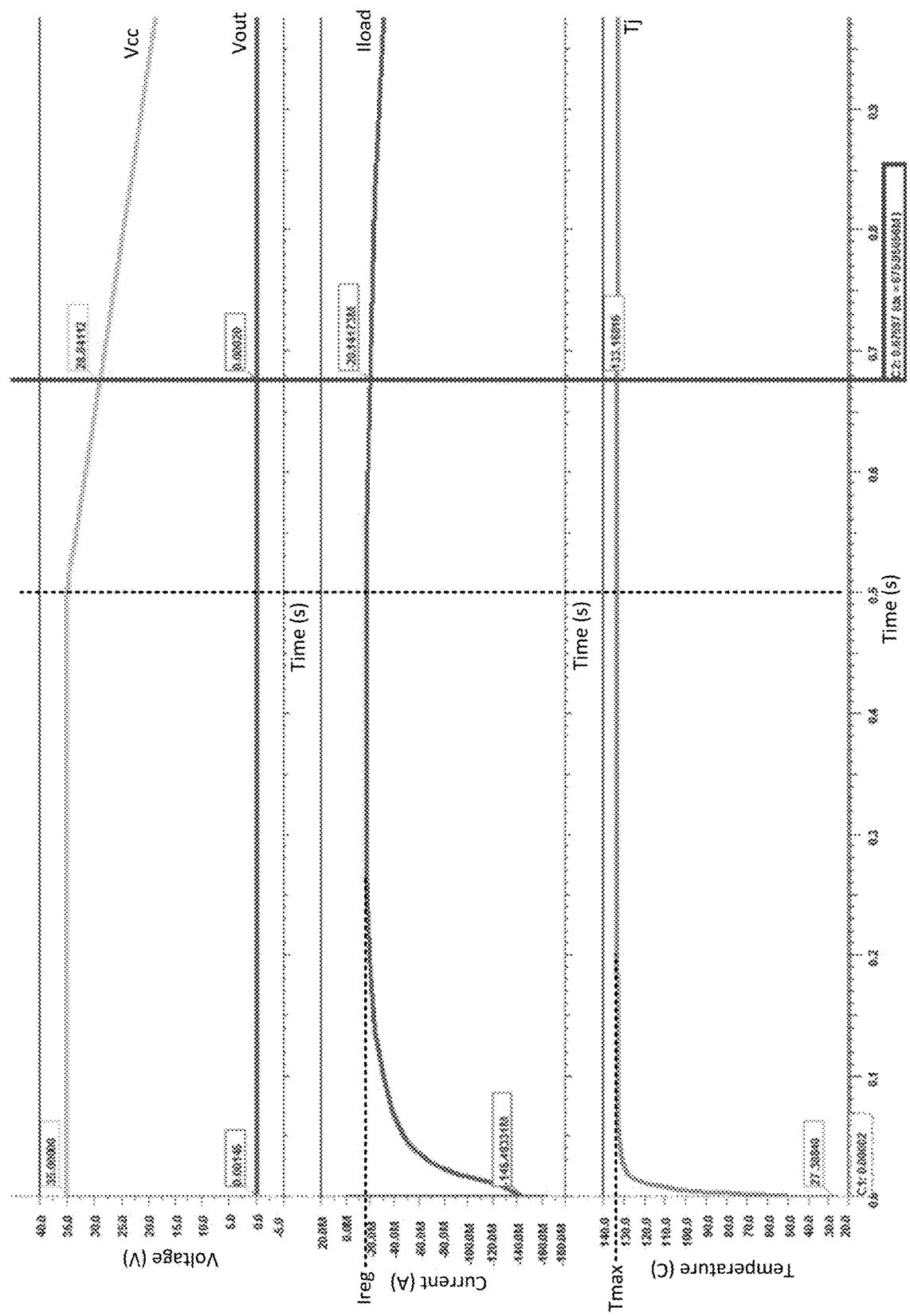
FIG. 5 is a graph showing the load current provided by the driver circuit of FIG. 3 as well as voltage across the load, over time and temperature, in a second operating condition.

A second example of this operation can be seen in FIG. 5. In this scenario, the drain of PMOS transistor MP2 is effectively shorted to ground, and therefore Vout remains within a threshold of zero. However, in this example, Vcc is set at 35 V, but at time 0.5 s, begins to fall until it reaches 20 V. At time 0 (the beginning), the voltage Tj indicates an operating temperature of 27.38° C., which is well below Tmax as set for this scenario (which represents an operating temperature of 133° C.). Resultingly, the load current Iload is generated as being equal to Imax for this scenario (the magnitude of which is 145.5 mA). However, as time begins to pass, the operating temperature begins to rise (and Tj therefore rises), and the magnitude of load current Iload resultingly falls. As Tj approaches Tmax, indicating that the operating temperature approaches 133° C., the magnitude of the load current Iload approaches the regulated value Ireg (the magnitude of which is set to 16.6 mA for this scenario). Regulation maintains Iload at Ireg, which in turn maintains Tj at Tmax (and thus maintains the operating temperature at of 133° C.). Notice here that time 0.5 s, as stated, Vcc begins to fall. As Vcc falls, the magnitude of the load current Iload increases accordingly, as an increased load current Iload is required to maintain Tj at Tmax.

Figure 6:
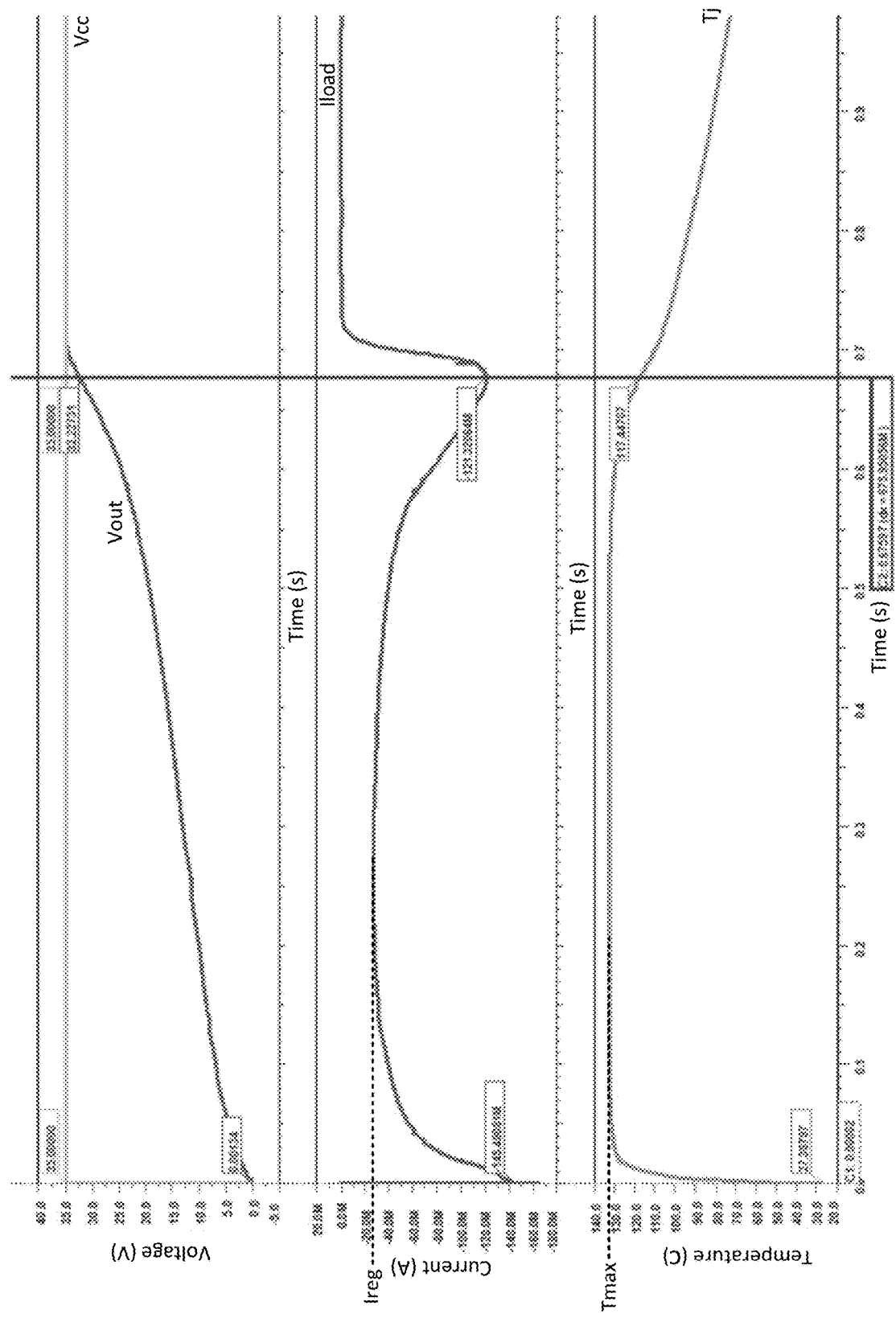
FIG. 6 is a graph showing the load current provided by the driver circuit of FIG. 3 as well as voltage across the load, over time and temperature, in a third operating condition.

A third example of this operation can be seen in FIG. 6. In this scenario, the load 103 is modeled as a 1 mF capacitor. Also in this example, Vcc is set at 35 V and remains steady. At time 0 (the beginning), the voltage Tj indicates an operating temperature of 27.38° C., which is well below Tmax as set for this scenario (which represents an operating temperature of 133° C.). Resultingly, the load current Iload is generated as being equal to Imax for this scenario (the magnitude of which is 145.5 mA). However, as time begins to pass, the operating temperature begins to rise (and Tj therefore rises), and the magnitude of load current resultingly falls. As Tj approaches Tmax, indicating that the operating temperature approaches 133° C., the magnitude of the load current Iload approaches the regulated value Ireg (the magnitude of which is set to around 30 mA for this scenario). Regulation initially maintains Iload at Ireg, which in turn maintains Tj at Tmax (and thus maintains the operating temperature at of 133° C.).

Here, understand that as the capacitor of the load 103 charges to 35 V, Vout begins to rise until at time 0.67 s, the capacitor is fully charged and Vout nears Vcc. Notice that as Vout rises, Tj (and thus the operating temperature) begins to fall, and the magnitude of the load current Tout begins to increase accordingly, until at time 0.67 s, the magnitude of the load current Tout has increased to 121.32 mA. After this time, the load 103 (here, a capacitor) has charged such that Vout is near Vcc, and therefore the load current Iload quickly falls approximately to zero, despite the fact that Tj continues to fall.

Figure 7:
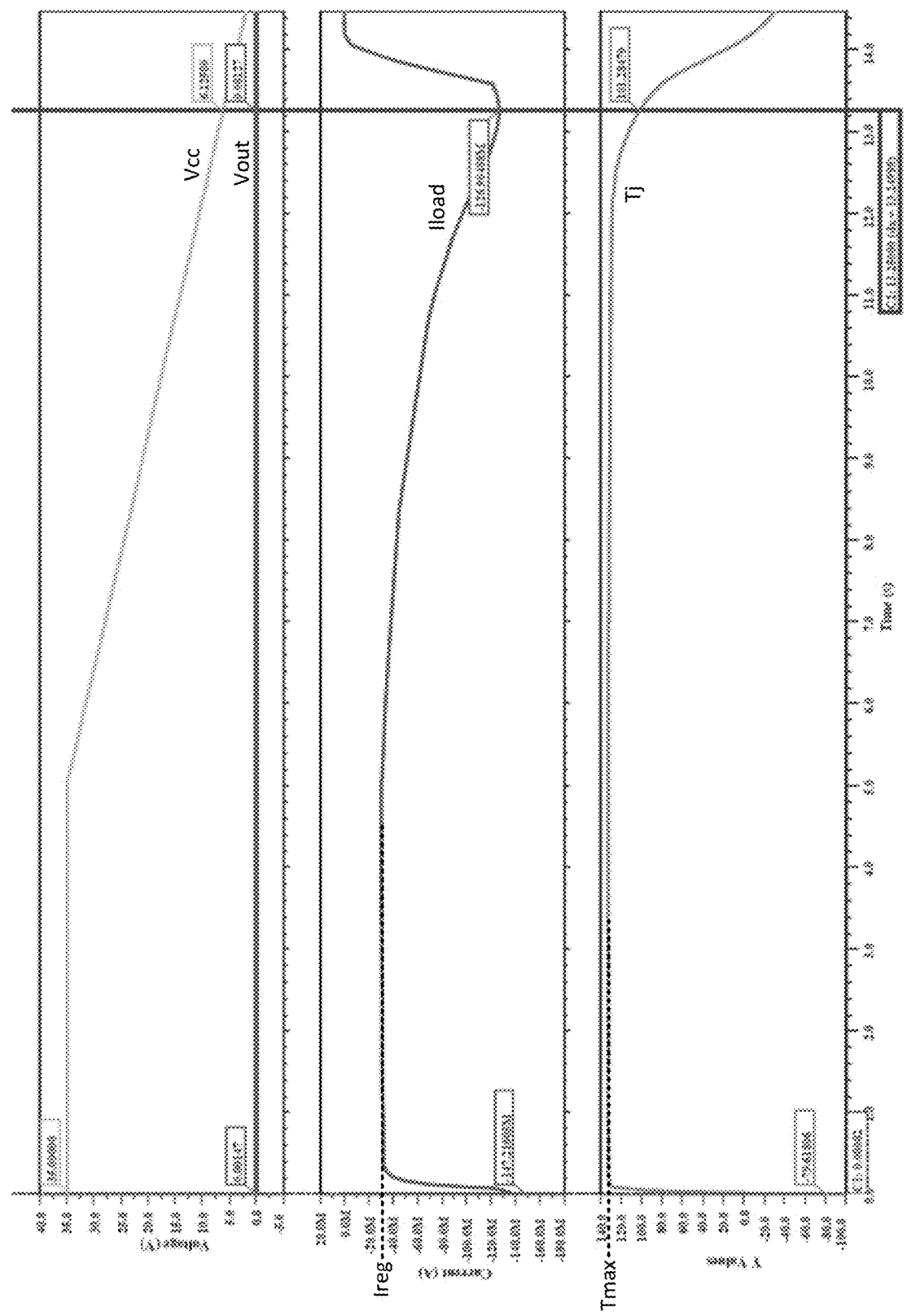
FIG. 7 is a graph showing the load current provided by the driver circuit of FIG. 3 as well as voltage across the load, over time and temperature, in a fourth operating condition.

As previously pointed out, if Tj falls to be less than Tmax, then the amplifier 101 will generate the control signal 105 so as to increase the load current Iload until it becomes once again equal to Imax (operating temperature permitting), and will maintain the load current Iload at Imax provided Tj remains less than Tmax. An example of this operation can be seen in FIG. 7. In this scenario, the drain of PMOS transistor MP2 is effectively shorted to ground, and therefore Vout remains within a threshold of zero. However, in this example, Vcc is set at 35 V, but approximately at a time of 5s after start, Vcc begins to fall asymptotically to zero.

At time 0 (the beginning), the voltage Tj indicates an operating temperature of −79.6° C., which is well below Tmax as set for this scenario (which represents an operating temperature of approximately 130° C.). Resultingly, the load current Iload is generated as being equal to Imax for this scenario (the magnitude of which is 147.2 mA). However, the operating temperature (and thus Tj) quickly increases to a Tmax of approximately 130° C. As Tj approaches Tmax, the magnitude of the load current Iload approaches the regulated value Ireg (the magnitude of which is set to approximately 30 mA for this scenario), and is then maintained at this level so as to maintain Tj at Tmax. Note that here, the operating temperature begins to fall at a time of 12 s after start (and Tj therefore falls), and the magnitude of load current Iload is resultingly increased to −126.9 mA. At a time of approximately 13.5 s after start, the magnitude of the load current Iload quickly drops because the transistor MP2 enters into the linear operation region due to VCC falling sufficiently, and therefore the transistor MP2 acts as a resistor at this point.

The advantages provided by the driver circuits described above are evident. Driver performance is maximized due to the regulation, meaning operation is kept safe yet is not overly conservative, meaning that the maximum possible current (up to Imax) for the given operating temperature is provided at all times. In addition, the driver circuits require no duty cycle control circuits or control software, employ no duty cycle control circuits, and provide a continuous load current during operation. Still further, the regulation and the use of the thermal feedback adapts to PVT variation, external voltage and temperature variation, and IC junction to ambient thermic resistance variation.

While the disclosure has been described with respect to a limited number of embodiments, those skilled in the art, having benefit of this disclosure, will appreciate that other embodiments can be envisioned that do not depart from the scope of the disclosure as disclosed herein. Accordingly, the scope of the disclosure shall be limited only by the attached claims.

The invention claimed is:

1. A driver circuit, comprising:
a temperature sensor configured to generate a first voltage representative of current operating temperature of the driver circuit;
an amplifier configured to compare the first voltage to a second voltage representative of an upper threshold operating temperature, and to generate a control signal based upon the comparison; and
a variable current source configured to generate a load current as a function of the control signal;
wherein the amplifier generates the control signal so as to cause the variable current source to generate the load current as having a magnitude equal to an upper threshold, when the first voltage is less than the second voltage; and
wherein the amplifier generates the control signal so as to cause the variable current source to generate the load current as having a magnitude that is decreasing until the first and second voltages are equal, and then generates the control signal so as to cause the variable current source to maintain the magnitude of the load current at a level at which the first and second voltages are equal.

2. The driver circuit of claim 1, wherein the temperature sensor comprises a bipolar junction transistor.

3. The driver circuit of claim 1, further comprising a voltage divider coupled between a bandgap voltage and ground, with the second voltage being generated at a tap of the voltage divider.

4. The driver circuit of claim 3, further comprising a bandgap voltage generator generating the bandgap voltage.

5. A driver circuit, comprising:
a temperature sensing circuit configured to generate a first voltage representative of current operating temperature of the driver circuit;
a voltage controlled current source configured to compare the first voltage to a second voltage representative of an upper threshold operating temperature, and to generate a control signal based upon the comparison; and
an output stage configured to generate a load current as a function of the control signal;
wherein the voltage controlled current source generates the control signal so as to cause the output stage to generate the load current as having a magnitude equal to an upper threshold, when the first voltage is less than the second voltage; and
wherein the voltage controlled current source generates the control signal so as to cause the output stage to generate the load current as decreasing in magnitude until the first and second voltages are equal, and then generates the control signal so as to cause the output stage to maintain the magnitude of the load current at a level at which the first and second voltages are equal.

6. The driver circuit of claim 5, wherein the temperature sensing circuit comprises a bipolar junction transistor having a collector coupled to a first supply voltage, a base coupled to a bandgap voltage, and an emitter coupled to the voltage controlled current source.

7. The driver circuit of claim 6, further comprising a resistor coupled between the emitter of the bipolar junction transistor and ground, with the first voltage being generated across the resistor.

8. The driver circuit of claim 5, wherein the voltage controlled current source comprises an operational transconductance amplifier having a non-inverting terminal coupled to the second voltage and an inverting terminal coupled to the first voltage.

9. The driver circuit of claim 8, further comprising a voltage divider coupled between a bandgap voltage and ground, with a tap of the voltage divider being coupled to the non-inverting terminal of the operational transconductance amplifier.

10. The driver circuit of claim 9, further comprising a bandgap voltage generator generating the bandgap voltage.

11. The driver circuit of claim 5, wherein the output stage comprises a current amplifier configured to amplify a magnitude of a current of the control signal.

12. The driver circuit of claim 11, wherein the output stage further comprises a current source generating the load current as a function of the amplified control signal.

13. The driver circuit of claim 12, wherein the current source comprises:
a first current mirror receiving the control signal as input and generating a second control signal as output; and
a second current mirror receiving the second control signal as input and generating the load current as output.

14. The driver circuit of claim 13,
wherein the first current mirror comprises:
a first NMOS transistor having a drain coupled to the current amplifier to receive the amplified control signal, a source coupled to ground, and a gate coupled to the drain of the first NMOS transistor; and a second NMOS transistor having a drain drawing the second control signal, a source coupled to ground, and a gate coupled to the gate of the first NMOS transistor; and wherein the second current mirror comprises:

a first PMOS transistor having a source coupled to a second supply voltage, a drain coupled to the drain of the second NMOS transistor, and a gate coupled to the drain of the first PMOS transistor; and a second PMOS transistor having a source coupled to the second supply voltage, a drain generating the load current, and a gate coupled to the gate of the first PMOS transistor.

15. A method of generating a load current for driving a load, the method comprising:

generating a first voltage representative of a current operating temperature;

comparing the first voltage to a second voltage representative of an upper threshold operating temperature;

generating the load current having a magnitude equal to an upper threshold when the first voltage is less than the second voltage; and generating the load current as having a magnitude with a decreasing slope when the first voltage is greater than the second voltage.

16. The method of claim 15, further comprising, when the first and second voltages are equal, generating the load current as having a magnitude that remains at a level at which the first and second voltages are equal.

17. The method of claim 15, wherein generating the load current as having a magnitude with a decreasing slope in performed until the first and second voltages are equal, and then the magnitude of the load current is continuously varied such that the first and second voltages remain equal.

* * * * *

UNITED STATES PATENT AND TRADEMARK OFFICE
CERTIFICATE OF CORRECTION

PATENT NO. : 10,534,388 B1
APPLICATION NO. : 16/361545
DATED : January 14, 2020
INVENTOR(S) : Santo Ilardo Page 1 of 1

It is certified that error appears in the above-identified patent and that said Letters Patent is hereby corrected as shown below:

In the Specification

At Column 6, Line 67, please replace [[ asymptotically ]] with -- asymptomatically --.

In the Claims

At Column 10, Claim Number 17, Line 14, please replace the phrase [[ slope in ]] with -- slope is --.

Signed and Sealed this
Tenth Day of November, 2020

Andrei Iancu
*Director of the United States Patent and Trademark Office*